(12) United States Patent
Decker et al.

(10) Patent No.: US 8,698,091 B2
(45) Date of Patent: Apr. 15, 2014

(54) SEMICONDUCTOR MOS ENTRANCE WINDOW FOR RADIATION DETECTORS

(75) Inventors: Keith W. Decker, Pleasant Grove, UT (US); Derek Hullinger, Orem, UT (US); Mark Alan Davis, Springville, UT (US)

(73) Assignee: Moxtek, Inc., Orem, UT (US)

(*) Notice: Subject to any disclaimer, the term of this patent is extended or adjusted under 35 U.S.C. 154(b) by 198 days.

(21) Appl. No.: 13/325,709

(22) Filed: Dec. 14, 2011

(65) Prior Publication Data

US 2012/0313195 A1 Dec. 13, 2012

Related U.S. Application Data

(63) Continuation-in-part of application No. 12/617,313, filed on Nov. 12, 2009, now Pat. No. 8,314,468, which is a continuation-in-part of application No. 12/575,939, filed on Oct. 8, 2009, now abandoned.

(60) Provisional application No. 61/185,754, filed on Jun. 10, 2009, provisional application No. 61/185,679, filed on Jun. 10, 2009, provisional application No. 61/484,428, filed on May 10, 2011.

(30) Foreign Application Priority Data

Jul. 2, 2009 (JP) .................... 2009-157627

(51) Int. Cl.
*G01T 1/24* (2006.01)
(52) U.S. Cl.
USPC ................... 250/370.1; 250/336.1
(58) Field of Classification Search
USPC .......................... 250/336.1, 370.01
See application file for complete search history.

(56) References Cited

U.S. PATENT DOCUMENTS

| 4,879,466 | A | 11/1989 | Kitaguchi et al. |
| 5,051,801 | A | 9/1991 | Van Eijk et al. |
| 6,249,033 | B1 | 6/2001 | Castoldi et al. |
| 6,421,414 | B1 | 7/2002 | Huber |
| 6,426,993 | B1 | 7/2002 | Satoh |
| 7,105,827 | B2 | 9/2006 | Lechner et al. |
| 7,238,949 | B2 | 7/2007 | Struder et al. |
| 2005/0173733 | A1* | 8/2005 | Struder et al. ............ 257/202 |
| 2007/0072332 | A1 | 3/2007 | Kemmer |
| 2010/0163740 | A1 | 7/2010 | Matsuura |
| 2010/0314706 | A1 | 12/2010 | Hullinger et al. |

FOREIGN PATENT DOCUMENTS

| JP | H02297977 | 12/1990 |
| JP | 2008153256 | 7/2008 |
| JP | 2008258348 | 10/2008 |
| WO | WO2011002573 | 1/2011 |

OTHER PUBLICATIONS

U.S. Appl. No. 12/617,313, filed Nov. 12, 2009; Derek Hullinger; office action dated Jul. 30, 2012.

(Continued)

*Primary Examiner* — Jae Lee
(74) *Attorney, Agent, or Firm* — Thorpe North & Western LLP

(57) ABSTRACT

A semiconductor detector device, such as a PIN diode or silicon drift detector, including a substrate with an entrance window. The entrance window comprises a conductive layer, and an insulating layer disposed between the conductive layer and the substrate. The insulating layer and conductive layer cover a center portion of the surface of the substrate.

22 Claims, 6 Drawing Sheets

(56) References Cited

OTHER PUBLICATIONS

U.S. Appl. No. 12/617,313, filed Nov. 12, 2009; Derek Hullinger; notice of allowance dated Oct. 3, 2012.

U.S. Appl. No. 12/617,313, filed Nov. 12, 2009; Derek Hullinger; office action dated Sep. 13, 2012.

U.S. Appl. No. 12/617,313, filed Nov. 12, 2009; Derek Hullinger; office action issued Jan. 10, 2012.

Matsurra et al; Research for Simplifying structures of Si X-Ray Detectors (Silicon Drift Detector) and Improving Sensitivity of High-Energy X-Rays; Dec. 2008; p. 5-10; IEICE Technical Report; The Institute of Electronics; Information and Communication Engineers.

Kitanoya et al; Simplification of Structures of Si X-Ray Detectors (Silicon Drift Detector), Evaluation by Simulation; Dec. 2009; Information and Communication Engineers.

Matsurra et al. Simplification of Structures and Improvement of Sensitivity of High-Energy X-Ray Detectors (Silicon Drift Detector); 2010; vol. J93-C, No. 9; p. 1-8.

Lechner et al.; Silicon Drift Detectors for High Resolution Room Temperature X-Ray Spectroscopy; Nuclear Instruments & Methods in Physics Research; A377 (1996); p. 346-354.

* cited by examiner

SEMICONDUCTOR MOS ENTRANCE WINDOW FOR RADIATION DETECTORS

CLAIM OF PRIORITY

Priority is claimed to U.S. Provisional Patent Application Ser. No. 61/484,428, filed on May 10, 2011; which is hereby incorporated herein by reference in its entirety.

This is a continuation-in-part of U.S. patent application Ser. No. 12/617,313, filed on Nov. 12, 2009 now U.S. Pat. No. 8,314,468, which is a continuation-in-part of U.S. patent application Ser. No. 12/575,939 filed on Oct. 8, 2009, which claims priority to Japan Patent Application Serial Number 2009-157627, filed on Jul. 2, 2009; and which claims priority to U.S. Provisional Patent Application Nos. 61/185,754 and 61/185,679, both filed on Jun. 10, 2009; all of which are hereby incorporated herein by reference in their entirety.

BACKGROUND

1. Field of the Invention

The present application related generally to semiconductor detector devices, such as a PIN diodes or a silicon drift detectors.

2. Related Art

Prior art PIN diodes 110, such as is shown in FIG. 11, can include an intrinsic region or substrate 11, which can have a first conduction type, disposed between a top region 12, having the first conduction type, and an entrance window 115, having a second conduction type. The top region 12 can be substantially more highly doped than the substrate 11. The first conduction type is typically n type and the second conduction type is typically p type. A voltage V11 can be applied to the top region 12 and another voltage V12 can be applied to the entrance window.

For example, the top region 12 can be n-doped and can have a voltage of about 100 volts. The entrance window 115 can be p-doped and can have a voltage of about 0 volts. An x-ray photon can be absorbed in the substrate 11, resulting in production of electron-hole pairs. The number of electron-hole pairs produced is directly proportional to the energy of the x-ray photon and provides information about the type of material or process that produced the x-ray photon.

The free electrons can be drawn to the top region 12 and the holes can be drawn to the entrance window 115 due to the voltage differential between the entrance window 115 and the top region 12. The motion of the electrons and holes can generate a signal whose size is proportional to the number of electrons. Based on the size of this signal, the energy of the x-ray photon, and thus the type of material or physical process that produced the x-ray photon, may be determined.

Some x-ray photons can be absorbed in the entrance window 115 and produce electron-hole pairs in the entrance window. Such electrons typically recombine with holes and do not move through the substrate 11. No signal results from such x-ray photons. Thus it can be beneficial to keep the entrance window 115 thin to avoid uncounted electron-hole pairs resulting from x-ray photons being absorbed in the entrance window 115.

Entrance windows can be made by epitaxy deposition, diffusion, or implantation, such as p-doping a substrate, for example with boron. A junction layer 116 can exist between the entrance window 115 and the substrate 11 in which there is a gradual change in concentration of dopant atoms. For example, if the entrance window is p doped and the substrate is n doped, then the junction layer 116 can have a gradual reduction of p dopants, from a high concentration near the entrance window 115 to a lower concentration of p dopants and eventually no p dopants moving farther from the entrance window 115 into the substrate 11. X-ray photons absorbed in the junction layer 116 can also cause production of electron hole pairs. For a single x-ray photon being absorbed in or near the junction layer 116, sometimes only a fraction of the electrons produced flow through the substrate 11 and reach the top region 12 while other electrons produced will recombine with holes. This results in only a partial electron signal and contributes to background signal. Background signal can cause difficulty in distinguishing elements that are of low percent in a sample being analyzed because signals from such low percentage elements can be indistinguishable from the background signal. Therefore it can be beneficial to reduce the thickness of this junction layer 116 in order to reduce the background signal.

Prior art silicon drift detectors 120, such as is shown in FIG. 12, operate similar to PIN diodes with an intrinsic region or substrate 11 with a first conduction type, a top island region 22 having the first conduction type disposed at one surface and an entrance window 115 having the second conduction type disposed at an opposing surface. A difference between silicon drift detectors 120 and PIN diodes 110 is the addition of doped rings 125 having the second conduction type surrounding the top island region 22. The rings can be electrically coupled such as by a MOSFET structure or resistor chain 127. A voltage V13 can be applied to an inner doped ring 125a and a different voltage V14 can be applied to an outer doped ring 125b. This voltage differential can aid in drawing electrons towards the top island region 22. For example, a voltage V12 on the entrance window 115 can be −100 volts, a voltage V14 on an outer ring 125b can be −160 volts, a voltage V13 on an inner ring 125a can be −20 volts, and a voltage V11 on the top island region 22 can be about 0 volts. Silicon drift detectors can suffer from the same entrance window problems as described above for PIN diodes, such as uncounted x-ray photons resulting from production of electrons in the entrance window 115 and background signal due to production of electrons in the junction layer 116.

SUMMARY

It has been recognized that it would be advantageous to provide a semiconductor detector device, such as a PIN diode or a silicon drift detector, that has reduced background signal and reduced lost x-ray photon counts. The present invention is directed to a semiconductor detector device that satisfies these needs.

The device comprises a substrate having a first conduction type and including a top surface and a bottom surface. A top region, configured for electrical connection to the top surface of the substrate, can be disposed at the top surface of the substrate. A conductive layer can be disposed at the bottom surface of the substrate. An insulating layer can be disposed between the conductive layer and the substrate. The insulating layer can cover a center portion of the bottom surface of the substrate. The insulating layer and the conductive layer can be an entrance window for the semiconductor device.

A bottom doped region can be disposed in the substrate at the bottom surface of the substrate. The bottom doped region can have a second conduction type. The bottom doped region can have an inner perimeter facing the center portion of the bottom surface of the substrate. The insulating layer and the conductive layer can extend at least to the inner perimeter of the bottom doped region.

The insulating layer and the conductive layer can be applied to the substrate as very thin layers, thus reducing the fraction of x-ray photons being absorbed in the entrance window and resulting in reduced x-ray photon counts. When appropriate biases are applied to the conductive layer and to the bottom doped region, an inversion layer of a second conduction type forms at the boundary of the substrate and the insulating layer. This layer constitutes a transition between the entrance window and the substrate that can be very sharp, thus reducing partially counted x-ray photon signal counts, resulting in reduced background signal.

DEFINITIONS

Figure 1:
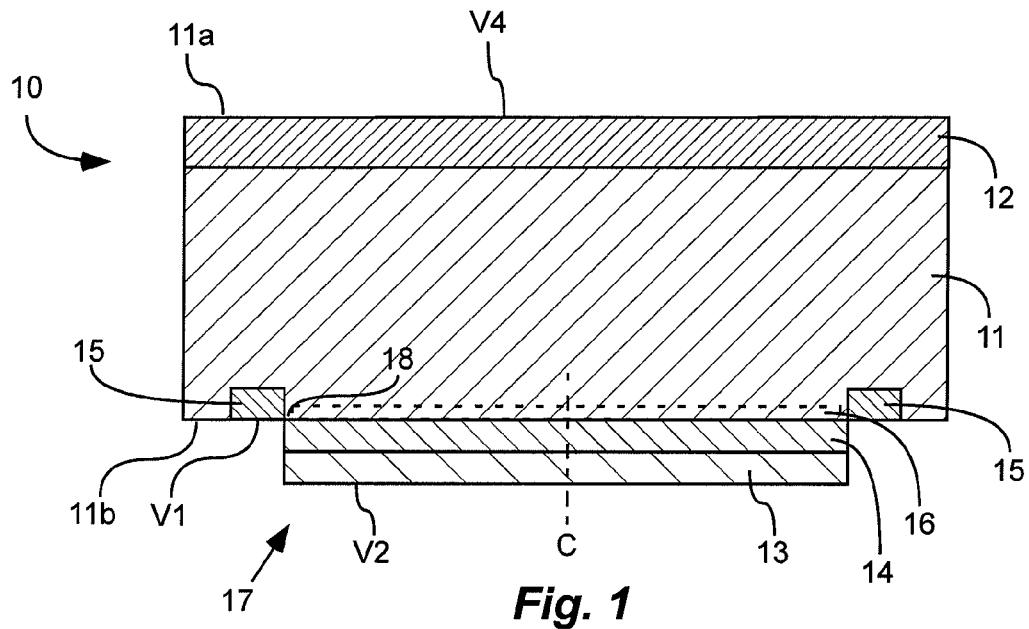
FIG. 1 is a schematic cross-sectional side view of a semiconductor detector device in accordance with an embodiment of the present invention.

As used herein, the term "detector" can mean a device for detecting high-energy electromagnetic radiation (x-rays or gamma rays) or particulate radiation (fast electrons, heavy charged particles, or neutrons).

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

As illustrated in FIG. 1, a semiconductor detector device 10 is shown with a substrate 11 having a first conduction type and including a top surface 11a and a bottom surface 11b. A top region 12, configured for electrical connection to the top surface of the substrate, can be disposed at the top surface 11a of the substrate 11. The top region 12 can be configured for electrical connection to the top surface of the substrate by having the first conduction type with a substantially higher concentration of dopant than the substrate. For example, a top region 12 can be formed at a top surface 11a of a substrate 11, doped with boron, by implanting a higher concentration of boron to form this top region 12.

A conductive layer 13 can be disposed at the bottom surface 11b of the substrate 11. An insulating layer 14 can be disposed between the conductive layer 13 and the substrate 11 and the insulating layer 14 can cover a center portion C of the bottom surface 11b of the substrate 11. The conductive layer 13 can be disposed over a center portion C of the substrate 11. The insulating layer 14 and the conductive layer 13 can be an entrance window 17 for the semiconductor device 10.

A bottom doped region 15 can be disposed in the substrate 11 at the bottom surface 11b of the substrate 11. The bottom doped region 15 can have a second conduction type. The bottom doped region 15 can have an inner perimeter 18 facing the center portion C of the bottom surface 11b of the substrate 11.

The insulating layer 14 (and also possibly the conductive layer 13) can extend to the inner perimeter 18 of the bottom doped region 15. The insulating layer 14 (and also possibly the conductive layer 13) can extend to at least 25% of the inner perimeter 18 of the bottom doped region 15 in one embodiment, to at least 50% of the inner perimeter 18 of the bottom doped region 15 in another embodiment, to at least 75% of the inner perimeter 18 of the bottom doped region 15 in another embodiment, or to at least 90% of the inner perimeter 18 of the bottom doped region 15 in another embodiment.

Figure 2:
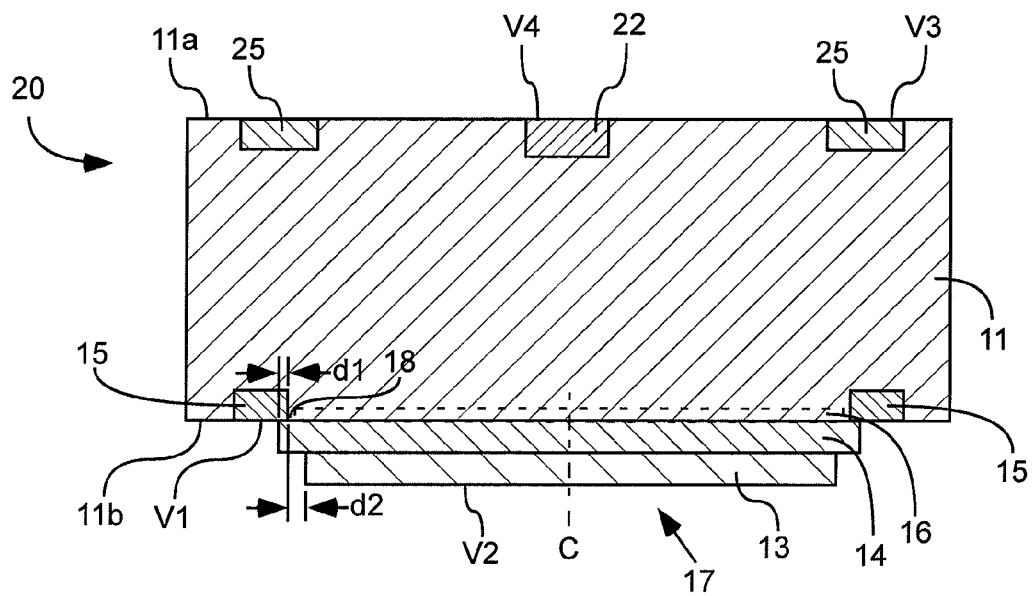
FIG. 2 is a schematic cross-sectional side view of a semiconductor detector device in accordance with an embodiment of the present invention.

As shown in FIG. 2, the insulating layer 14 can extend beyond the perimeter 18 of the bottom doped region 15, at least in one portion of the bottom doped region 18, by a distance d1. It can be beneficial in some applications, for improved inversion layer, for the conductive layer 13 to also extend beyond the perimeter 18 of the bottom doped region 15, at least in one portion of the bottom doped region 18, by a distance d1. Distance d1 can be greater than 1 nanometer in one embodiment, greater than 10 nanometers in another embodiment, greater than 100 nanometers in another embodiment, or greater than 1000 nanometers in another embodiment. The shape of the bottom doped region 18 and how much of the inner perimeter 18 touches or is overlapped by the insulating layer 14 (and also possibly the conductive layer 13) depends on specific detector application, cost, and manufacturing needs.

If the conductive layer 13 does not extend to the inner perimeter 18 of the bottom doped region 15, then a gap d2 can exist between the inner perimeter 18 and an edge of the conductive layer 13. It is better in many applications for this gap d2 to be small, thus gap d2 can be less than 40 micrometers in one embodiment, less than 30 micrometers in another embodiment, less than 20 micrometers in another embodiment, less than 10 micrometers in another embodiment, or less than 1 micrometer in another embodiment.

The insulating layer 14 alone can insulate the conductive layer 13 from the substrate 11 in one embodiment. The insulating layer 14 and the bottom doped contact together 15 can insulate the conductive layer 13 from the substrate 11 in another embodiment.

The insulating layer 14 and the conductive layer 13 can be applied to the substrate 11 as very thin layers, thus reducing a fraction of x-ray photons stopped in the entrance window 17 and reducing lost x-ray photon counts. Application of a voltage differential between the top region 12 and the entrance window 17 can result in formation of an inversion layer 16. This inversion layer 16 exists between the entrance window 17 and the substrate 11. The inversion layer 16 can be very thin. Partial counting of x-ray photon signals can occur in the inversion layer 16, however, because this inversion layer 16 can be very thin such partial counting is minimized and background signal is reduced. If the substrate is n doped, the inversion layer 16 can be a section with a high concentration of holes. If the substrate is p doped, the inversion layer 16 can be a section with a high concentration of electrons.

As a result of a thin entrance window 17 and a thin inversion layer 16, a peak signal to background signal ratio ("peak to background ratio") can be improved. In one embodiment, of semiconductor detector devices described herein, the device has a peak to background ratio of at least 40,000:1. In another embodiment, of semiconductor detector devices described herein, the device has a peak to background ratio of at least 70,000:1. In one embodiment, of semiconductor detector devices described herein, the device has a peak to background ratio of at least 100,000:1.

In one embodiment the first conduction type is n-doped and the second conduction type is p-doped. In another embodiment the first conduction type is p-doped and the second conduction type is n-doped.

In one embodiment, the top region 12 can extend across most or all of the top surface of the substrate, as shown in FIG. 1. This configuration is typical of a PIN diode.

In another embodiment, a top island region 22, having the first conduction type can be disposed in a smaller section of the top surface 11a of the substrate 11, typically at the center C of the top surface of the substrate, as shown in FIG. 2. The top island region 22 can be highly doped and can have a substantially higher concentration of dopant than the substrate 11. At least one top ring 25, having a second conduction type, can be disposed at the top surface 11a of the substrate 11 and can substantially circumscribe the top island region 22. This configuration is typical of a silicon drift detector. A top ring 25, or top rings, in a silicon drift detector 20 can be used to improve the flow of electrons to the top island region 22.

The bottom surface 11b of the substrate 11, in semiconductor detector device 10 or 20, can be configured for application of a first bias voltage V1. For example, a bottom doped region 15, having the second conduction type, can be implanted in the substrate 11 at the bottom surface 11b of the substrate 11 near an outer perimeter of the conductive layer 13. The first bias voltage V1 can be applied to the bottom doped region 15. A purpose of the bottom doped region 15 is to force a bias of the inversion layer 16 to be a specified voltage potential, namely the potential of the bottom doped region 15. "Configured for application of a first bias voltage" can also mean receiving the first bias voltage by electrical contact between the bottom doped region 15 and the conductive layer 13.

The conductive layer 13 can be doped polysilicon, also known as polycrystalline silicon. The polysilicon can be highly doped. The polysilicon can be doped with boron, phosphorous, or arsenic. The conductive layer 13 and the bottom doped region 15 can both be doped with the same material. The conductive layer 13 and the bottom doped region 15 can both be doped with the boron and/or can both be doped with phosphorous and/or can both be doped with arsenic.

The conductive layer 13 can be configured for application of a second bias voltage V2, such as by a bonding pad. "Configured for application of a second bias voltage" can also mean receiving the second bias voltage by electrical contact between the bottom doped region 15 and the conductive layer 13.

The second bias voltage V2 can be applied to the conductive layer 13. The first bias voltage can have the same polarity as the second bias voltage. For example, both voltages V1 and V2 can be negative or both voltages V1 and V2 can be positive. A third voltage V3 can be applied to the top ring 25. All three of these bias voltages V1-3 can have the same polarity. Typically a voltage V4 applied to the top region 12 or top island region 22 will have a more positive voltage than voltages V1-3 in order to draw electrons toward this top region 12 or 22.

Figure 3:
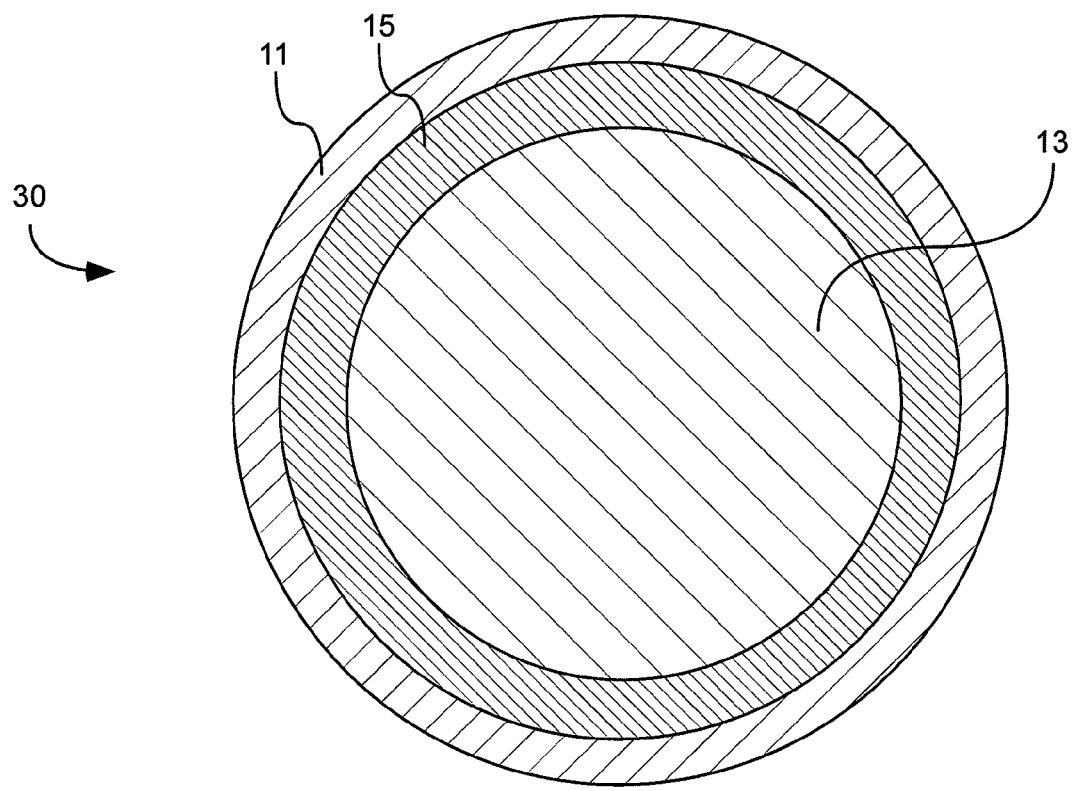
FIG. 3 is a schematic bottom view of a semiconductor detector device in accordance with an embodiment of the present invention.

In one embodiment of semiconductor detector device 30, shown in FIG. 3, the bottom doped region 15 can surround the insulating layer 14 and/or the conductive layer 13. The bottom doped region 15 can have an annular, square, or other shape. The insulating layer 14 is not shown in FIG. 3 because it can be covered by the conductive layer 13. In another embodiment, the bottom doped region 15 nearly surrounds or substantially surrounds the insulating layer 14 and the conductive layer 13. In another embodiment, the bottom doped region surrounds between 50% to 90% of the insulating layer 14 and the conductive layer 13. In another embodiment, the bottom doped region is merely a small doped region near an outer perimeter of the conductive layer. It can be beneficial for the bottom doped region to surround or nearly surround the conductive layer 13 in order to allow multiple locations for applying a voltage.

Figure 4:
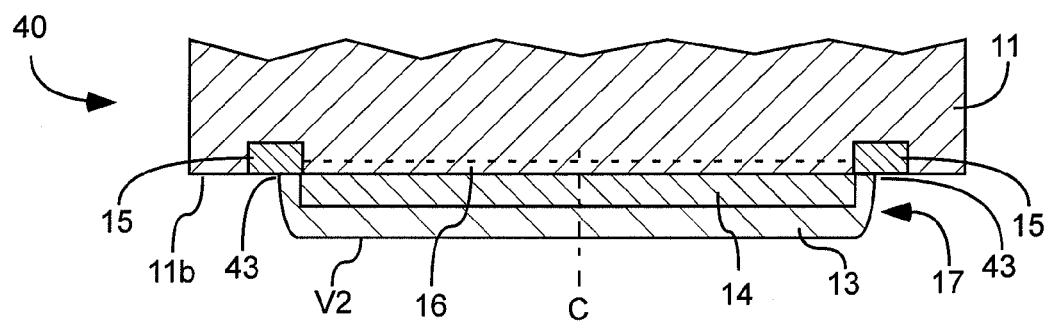
FIG. 4 is a schematic cross-sectional side view of a semiconductor detector device in accordance with an embodiment of the present invention.
Figure 5:
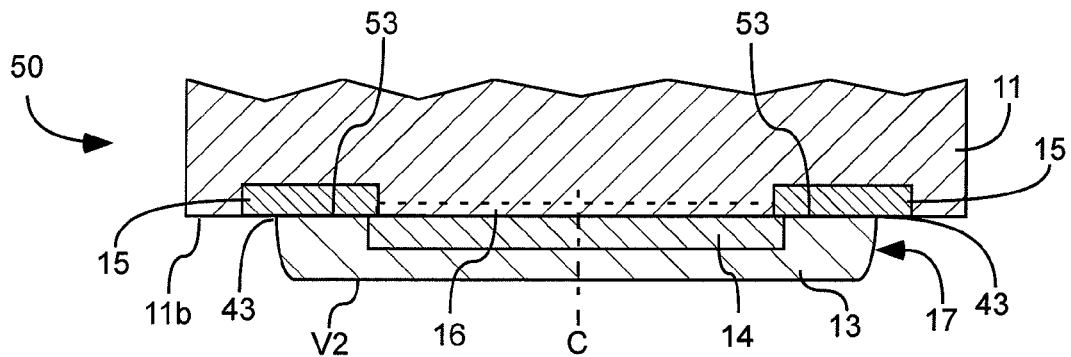
FIG. 5 is a schematic cross-sectional side view of a semiconductor detector device in accordance with an embodiment of the present invention.
Figure 6:
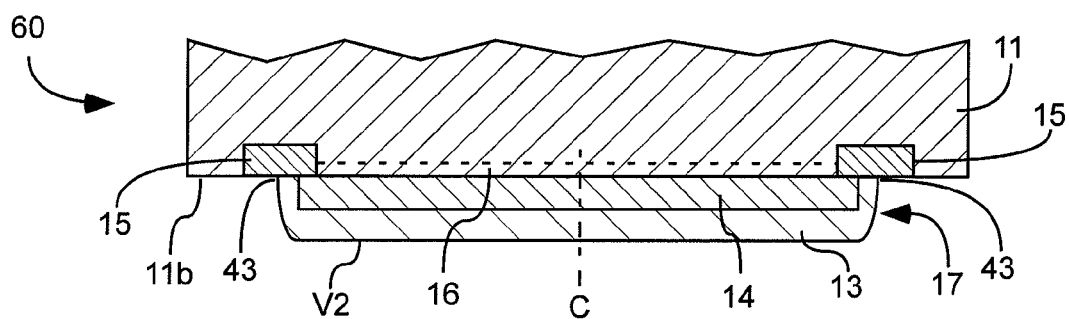
FIG. 6 is a schematic cross-sectional side view of a semiconductor detector device in accordance with an embodiment of the present invention.
Figure 7:
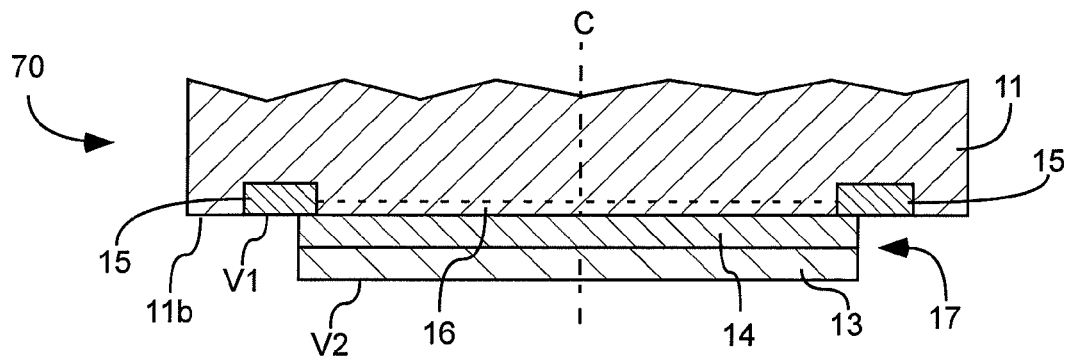
FIG. 7 is a schematic cross-sectional side view of a semiconductor detector device in accordance with an embodiment of the present invention.

In one embodiment, as illustrated in FIGS. 1-2, and 7, the conductive layer 13 does not contact the bottom doped region 15. In another embodiment, shown in FIGS. 4-6, the conductive layer 13 electrically contacts 43 the bottom doped region 15. If the conductive layer 13 electrically contacts 43 the bottom doped region 15, then there can be a need for only one external electrical connection for the bottom doped region 15 and the conductive layer 13. This external electrical connection can be connected to the bottom doped region 15 or the conductive layer 13. The component that does not have the external electrical connection can receive bias voltage through contact with the other.

An area of contact between the conductive layer 13 and the insulating layer 14 can be at least two times greater than an area of contact between the conductive layer 13 and the bottom doped region 15 in one embodiment, at least four times greater than an area of contact between the conductive layer and the bottom doped region 15 in another embodiment, at least six times greater than an area of contact between the conductive layer and the bottom doped region 15 in another embodiment, at least nine times greater than an area of contact between the conductive layer and the bottom doped region 15 in another embodiment, or at least twenty times greater than an area of contact between the conductive layer and the bottom doped region 15 in another embodiment. For example, an area of contact between the conductive layer and the bottom doped region 15 can be 1 mm$^2$ and an area of contact between the conductive layer 13 and the insulating layer 14 can be 20 mm$^2$, which is twenty times greater than the area of contact between the conductive layer 13 and the bottom doped region 15. Normally, the area of contact between the conductive layer 13 and the insulating layer 14 is desired to be large, in comparison with an area of contact between the conductive layer 13 and the bottom doped region 15, in order to maximize entrance window 17 size, but the ratio between the different areas of contact may differ depending on the application, semiconductor size, and manufacturing considerations.

The insulating layer 14 can be attached directly to the bottom surface of the substrate 11 in one embodiment. In another embodiment, another layer may be disposed between the insulating layer 14 and the substrate 11.

The insulating layer 14 and conductive layer 13 can cover a substantial portion of the bottom surface 11b of the substrate 11, to allow for a sufficiently large entrance window and efficient use of the semiconductor device. An advantage of covering less of the substrate surface 11b with the insulating layer 14 and conductive layer 13 is to avoid edge effects. The insulating layer 14 can cover at least 20% of the bottom surface of the substrate in one embodiment, at least 50% of the bottom surface of the substrate 11 in another embodiment, at least 75% of the bottom surface of the substrate 11 in another embodiment, or at least 90% of the bottom surface of the substrate 11 in another embodiment. The conductive layer 13 can cover at least 20% of the bottom surface of the substrate in one embodiment, at least 50% of the bottom surface of the substrate 11 in another embodiment, at least 75% of the bottom surface of the substrate 11 in another embodiment, or at least 90% of the bottom surface of the substrate 11 in another embodiment.

Figure 8:
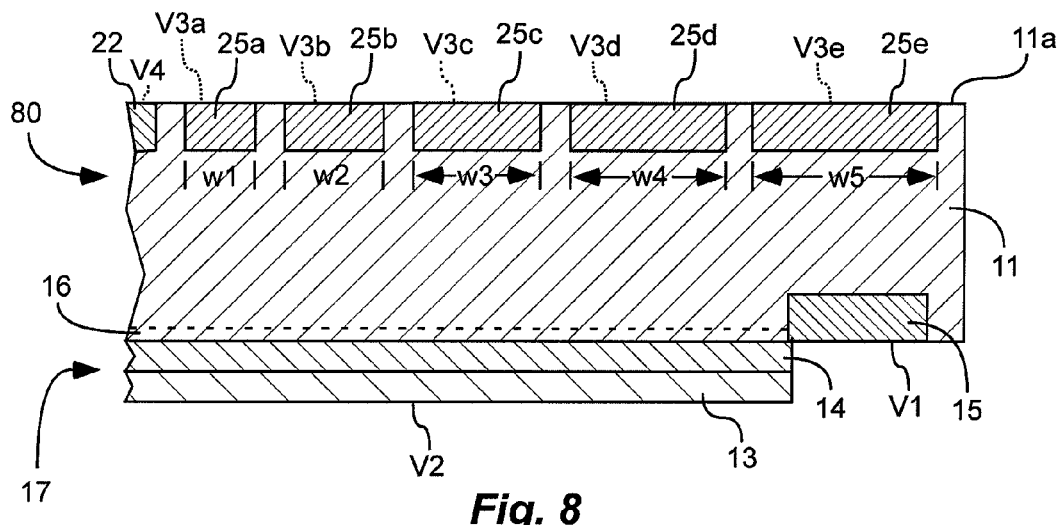
FIG. 8 is a schematic cross-sectional side view of a semiconductor detector device in accordance with an embodiment of the present invention.

A silicon drift detector 80 can include multiple top rings 25, such as the five doped rings 25a-e shown in FIG. 8. In one embodiment, a width of a ring 25e nearest an outer perimeter of the device is widest and a width of each successive ring closer to the top island region 22 is narrower than a width of an adjacent outer ring (w5>w4>w3>w2>w1).

In one embodiment, all top rings 25a-e can be connected to a voltage source V3a-e. Normally each voltage V3 applied is a different bias value and normally the voltage with the largest absolute value is an outer ring and the voltage drops in absolute value with each ring moving towards the top island region 22. It can be advantageous to apply voltage sources V3 to less than all the top rings 25 in order to allow less complicated electronic circuitry. In another embodiment, less than all top rings 25a-e, such as only three top rings 25, can be connected to a voltage source. Such a configuration can be effective because the electric potential of one ring can induce a potential in adjacent rings. For example, only voltage sources V3a, V3c, and V3e can be applied to top rings 25a, 25c, and 25e with no voltage sources applied to intermediate rings 25b and 25d.

Figure 9:
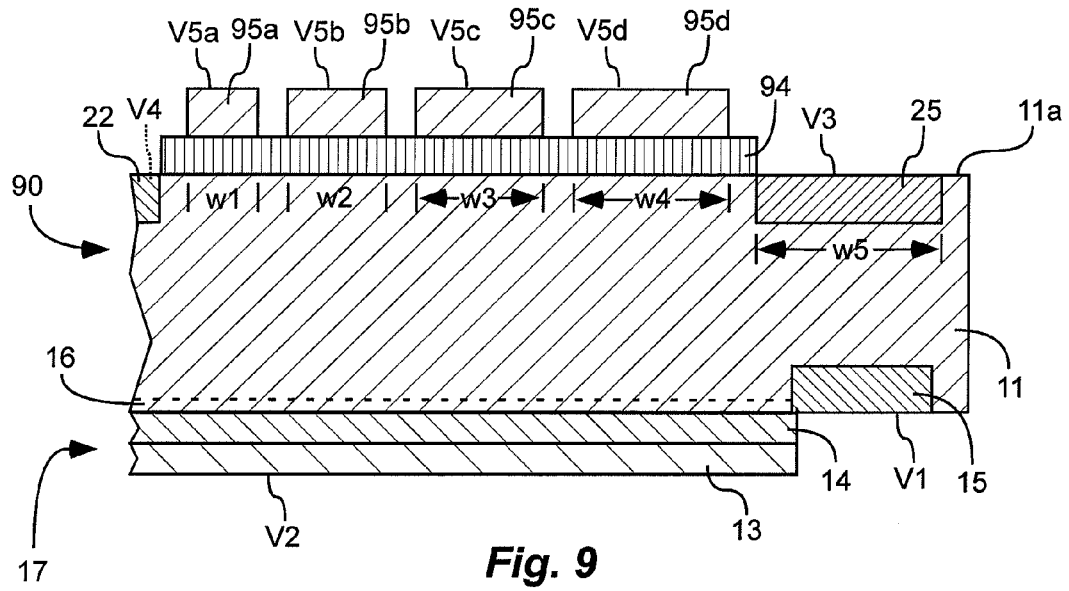
FIG. 9 is a schematic cross-sectional side view of a semiconductor detector device in accordance with an embodiment of the present invention.

A silicon drift detector 90 can include multiple top rings, such as one doped ring 25 and multiple field plate rings 95, such as four field plate rings 95a-d shown in FIG. 9. Field plate rings 95 are electrically isolated from the substrate 11 and closer to the top island region 22 than at least one doped ring 25. There can be additional doped rings, not shown, that are closer to the top island region 22, than one or more of the field plate rings 95. In one embodiment, a width w of the ring nearest an outer perimeter of the device 25 is widest and a width w of each successive ring closer to the top island region 22 is narrower than a width of an adjacent outer ring (w5>w4>w3>w2>w1).

In one embodiment, all top rings 95a-d and 25 can be connected to a voltage source V5a-d and V3. Normally each voltage applied is a different bias value and normally the voltage with the largest absolute value is an outer ring and the voltage drops in absolute value with each ring moving towards the top island region 22. It can be advantageous to apply voltage sources to less than all the top rings 95a-d and 25 in order to allow less complicated electronic circuitry. In one embodiment, less than all top rings can be connected to a voltage source. Such a configuration can be effective because the electric potential of one ring can induce a potential in adjacent rings.

Use of the afore mentioned doped top rings 25 and field plate rings 95 is described more fully in U.S.A Patent Publication Number 2010/0314706, which is incorporated herein by reference.

Figure 10:
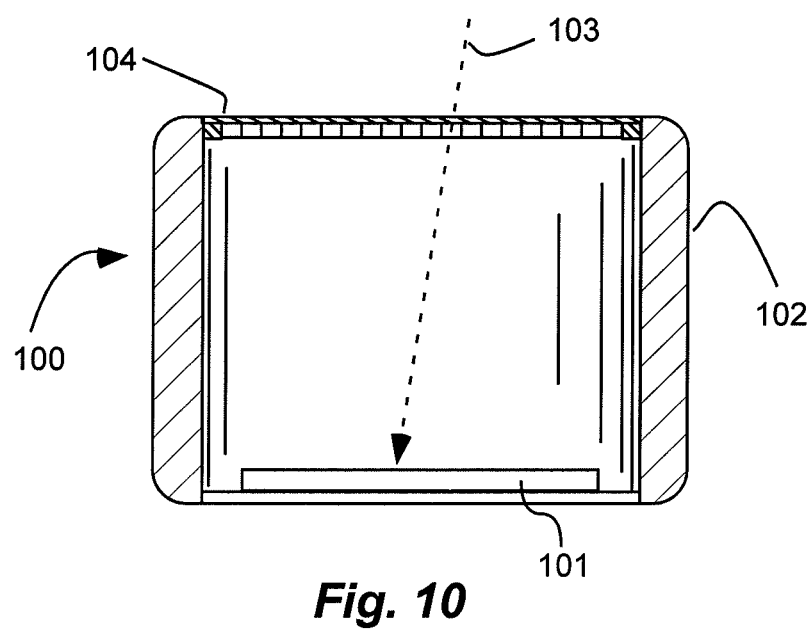
FIG. 10 is a schematic cross-sectional side view of an x-ray detector in accordance with an embodiment of the present invention.
Figure 11:
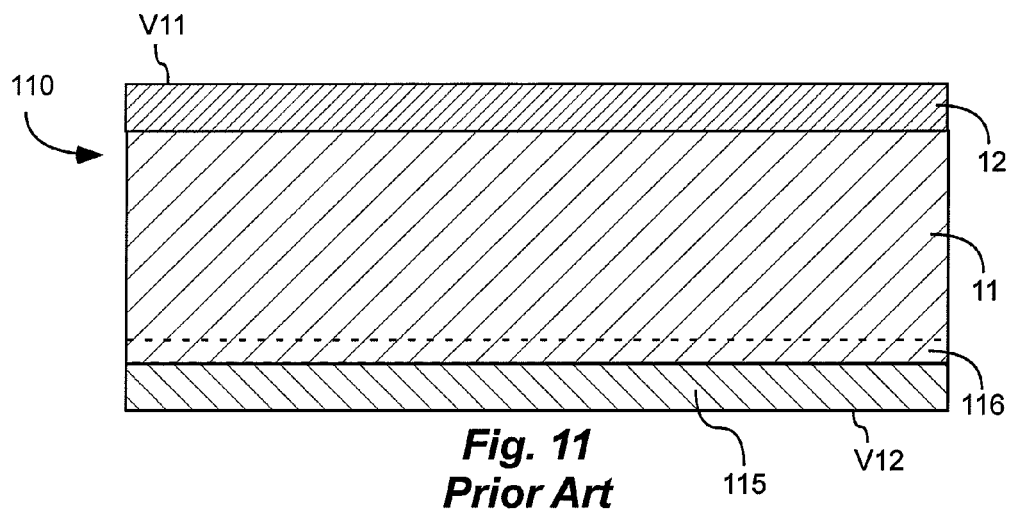
FIG. 11 is a schematic cross-sectional side view of a PIN diode in accordance with the prior art.
Figure 12:
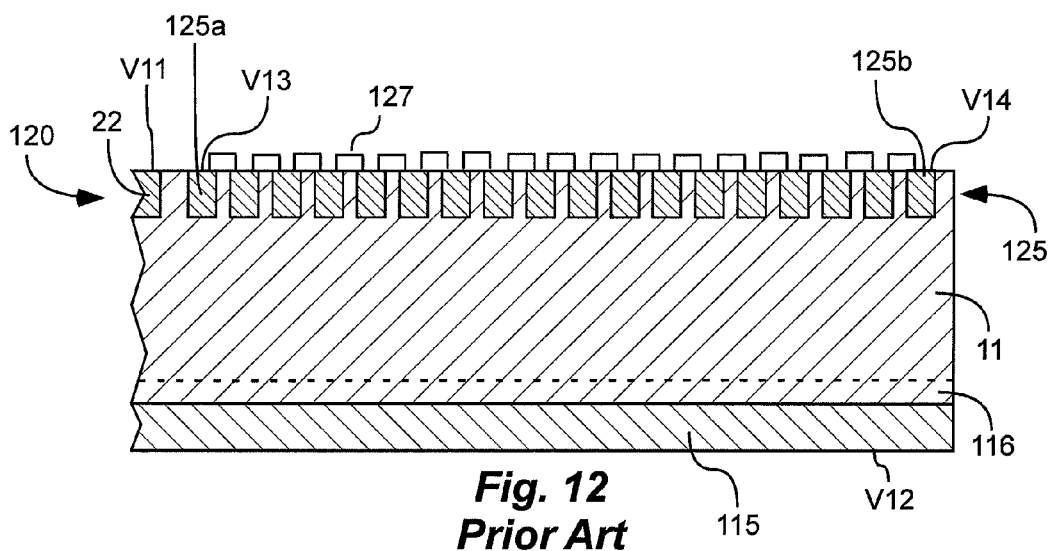
FIG. 12 is a schematic cross-sectional side view of a silicon drift detector in accordance with the prior art.

The semiconductor detector devices described herein can be used in x-ray detectors 100 as shown in FIG. 10. The semiconductor detector device 101 can be hermetically sealed in an enclosure 102 by a window 104 that will allow transmission of x-rays 103. The semiconductor detector device 101 can be positioned to receive x-rays 103.

How to Make:

A top region 12 in a device such as a PIN diode, or a top island region 22 such as in a silicon drift detector, can be formed by highly doping a region in the top surface of a semiconductor substrate 11. Top rings 25 and 95 can be applied as described in U.S.A Patent Publication Number 2010/0314706. The bottom doped region 15 can be applied by doping the substrate.

The insulating layer 14 can be applied to the bottom surface 11b of the substrate 11 by implantation into the substrate 11 or by deposition on top of the bottom surface 11b substrate 11. The insulating layer can comprise materials such as silicon nitride or an oxide. The conductive layer 13 can be applied to the bottom surface 11b of the substrate 11 by deposition on top of the insulating layer 14. The conductive layer 13 can comprise a material such as doped polycrystalline silicon or aluminum.

In one embodiment, the insulating layer 14 has a thickness of between 1 and 10 nanometers. In another embodiment, the insulating layer 14 has a thickness of between 9 and 100 nanometers. It can be beneficial to have a thin insulating layer in order to minimize lost signal due to uncounted electron-hole pairs. Practically, it can be difficult to form a very thin insulating layer without insulating layer defects, or breakdown of the insulating layer 14, that may allow the conductive layer 13 to contact the substrate 11. Separate biasing of the bottom doped region 18 and the conductive layer 13, and proper selection voltages, can allow use of a thinner insulating layer 14 without breakdown. It can be beneficial to have a thinner conductive layer. In one embodiment, the conductive layer 13 has a thickness of 50-150 nanometers.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein.

What is claimed is:

1. A semiconductor detector device, comprising:
   a) a substrate having a first conduction type and including a top surface and a bottom surface;
   b) a top region, having the first conduction type, disposed at the top surface of the substrate and configured for electrical connection to the top surface of the substrate;
   c) a conductive layer:
      i. disposed at the bottom surface of the substrate;
      ii. covering a center portion of the bottom surface of the substrate;
      iii. covering at least 20% of the bottom surface of the substrate;
   d) an insulating layer:
      i. disposed between the conductive layer and the substrate;
      ii. covering the center portion of the bottom surface of the substrate; and
      iii. covering at least 20% of the bottom surface of the substrate;
   e) a bottom doped region:
      i. disposed in the substrate at the bottom surface of the substrate;
      ii. having a second conduction type;
      iii. having an inner perimeter facing the center portion of the bottom surface of the substrate; and
   f) the insulating layer extending at least to the inner perimeter of the bottom doped region.

2. The device of claim 1, wherein the conductive layer extends at least to the inner perimeter of the bottom doped region.

3. The device of claim 1, wherein:
   a) the bottom doped region is an annular-shaped ring that surrounds the center portion of the bottom surface of the substrate; and
   b) the insulating layer and the conductive layer extend at least to the inner perimeter of the bottom doped region along the entire inner perimeter.

4. The device of claim 1, wherein a thickness of the insulating layer is between 1 nanometer and 10 nanometers.

5. The device of claim 1, wherein a thickness of the insulating layer is between 9 nanometer and 100 nanometers.

6. The device of claim 1, wherein:
   a) the bottom doped region is configured for application of a first bias voltage;
   b) the conductive layer is configured for application of a second bias voltage; and
   c) the first bias voltage is of the same polarity as the second bias voltage.

7. The device of claim 1, wherein the conductive layer directly contacts the bottom doped region.

8. The device of claim 1, wherein:
   a) the conductive layer comprises a doped material; and
   b) the conductive layer and the bottom doped region both comprise a same dopant material.

9. The device of claim 1, wherein the conductive layer comprises doped polysilicon.

10. The device of claim 1, wherein the insulating layer is attached directly to the bottom surface of the substrate.

11. The device of claim 1, wherein the insulating layer covers at least 50% of the bottom surface of the substrate.

12. The device of claim 1, wherein the semiconductor detector is a silicon drift detector and the silicon drift detector further comprises at least one top ring:
   a) including at least one ring having a second conduction type;
   b) disposed at the top surface of the substrate; and
   c) substantially circumscribing the top region.

13. The device of claim 1, wherein:
   a) the conductive layer directly contacts the bottom doped region; and
   b) an area of contact between the conductive layer and the insulating layer is at least nine times greater than an area of contact between the conductive layer and the bottom doped region.

14. A silicon drift detector device, comprising:
   a) a substrate having a first conduction type and including a top surface and a bottom surface;
   b) a top island region having the first conduction type disposed at the top surface of the substrate;
   c) the top island region having a substantially higher concentration of dopant than the substrate;
   d) at least one top ring, including at least one doped ring having a second conduction type, disposed at the top surface of the substrate and substantially circumscribing the top island region;
   e) a bottom doped region:
      i. disposed at the bottom surface of the substrate;
      ii. having a second conduction type; and
      iii. having an inner perimeter facing a center portion of the bottom surface of the substrate;
   f) a conductive layer:
      i. disposed at the bottom surface of the substrate;
      ii. covering a center portion of the bottom surface of the substrate;
      iii. covering at least 20% of the bottom surface of the substrate;
   g) an insulating layer:
      i. disposed between the conductive layer and the substrate;
      ii. covering the center portion of the bottom surface of the substrate;
      iii. covering at least 20% of the bottom surface of the substrate; and
   h) the insulating layer extending at least to the inner perimeter of the bottom doped region.

15. The device of claim 14, wherein:
   a) the bottom doped region is an annular-shaped ring; and
   b) the insulating layer and the conductive layer extend at least to the inner perimeter of the bottom doped region along the entire inner perimeter.

16. The device of claim 14, wherein:
   a) the bottom doped region is configured for application of a first bias voltage;
   b) the conductive layer is configured for application of a second bias voltage;
   c) the at least one top ring is configured for application of a third bias voltage; and
   d) the first bias voltage, the second bias voltage, and the third bias voltage all have the same polarity.

17. The device of claim 14, wherein the bottom doped region electrically contacts the conductive layer.

18. The device of claim 14, wherein the device has a peak to background ratio of at least 40,000:1.

19. The device of claim 14, wherein the insulating layer has a thickness of 1-10 nanometers and the conductive layer has a thickness of 50-150 nanometers.

20. The device of claim 14, wherein:
a) the at least one top ring comprises at least five doped rings;
b) a width of the ring nearest an outer perimeter of the device is widest and a width of each successive ring closer to the top island region is narrower than a width of an adjacent outer ring.

21. A silicon drift detector device, comprising:
a) an n doped substrate including a top surface and a bottom surface;
b) an n doped top region disposed at the top surface of the substrate, the n doped top region having substantially more n dopant than the substrate;
c) at least one top ring, including at least one p doped ring, disposed at the top surface of the substrate and substantially circumscribing the top region;
d) a conductive layer:
  i. disposed at the bottom surface of the substrate;
  ii. covering a center portion of the bottom surface of the substrate;
  iii. covering at least 20% of the bottom surface of the substrate;
e) an insulating layer:
  i. disposed between the conductive layer the substrate;
  ii. covering a center portion of the bottom surface of the substrate; and
  iii. covering at least 20% of the bottom surface of the substrate;
f) a p doped bottom doped region:
  i. disposed at the bottom surface of the substrate; and
  ii. having an inner perimeter facing and substantially surrounding the center portion of the bottom surface of the substrate;
g) the insulating layer extending at least to the inner perimeter of the bottom doped region along at least 90% of the entire inner perimeter.

22. The device of claim 21, wherein:
a) the bottom doped region is configured for application of a first bias voltage;
b) the conductive layer is configured for application of a second bias voltage;
c) the at least one top ring is configured for application of a third bias voltage; and
d) the first bias voltage, the second bias voltage, and the third bias voltage all have the same polarity.

* * * * *